(12) United States Patent
Wang

(10) Patent No.: US 9,461,622 B2
(45) Date of Patent: Oct. 4, 2016

(54) CAPACITANCE MULTIPLIER AND METHOD

(71) Applicant: NXP B.V., Eindhoven (NL)

(72) Inventor: Ge Wang, Tempe, AZ (US)

(73) Assignee: NXP B.V., Eindhoven (NL)

( * ) Notice: Subject to any disclaimer, the term of this patent is extended or adjusted under 35 U.S.C. 154(b) by 154 days.

(21) Appl. No.: 14/268,929

(22) Filed: May 2, 2014

(65) Prior Publication Data

US 2015/0318782 A1      Nov. 5, 2015

(51) Int. Cl.
*H03B 19/00* (2006.01)
*H03H 11/48* (2006.01)
*H02M 3/07* (2006.01)

(52) U.S. Cl.
CPC ............. *H03H 11/483* (2013.01); *H02M 3/07* (2013.01)

(58) Field of Classification Search
CPC ...... H03B 19/14; H03B 19/10; H03B 19/00; H03B 19/16; H03K 5/00006
USPC ................................. 327/114, 116, 119–122
See application file for complete search history.

(56) References Cited

U.S. PATENT DOCUMENTS 6,812,778 B1    11/2004  Yeo et al.
7,227,392 B2 *   6/2007  Yamamoto ............. H03B 19/14
                                                          327/116
7,598,793 B1    10/2009  Sengupta et al.
2014/0171931 A1 *  6/2014  Sisken ............... A61B 18/1206
                                                          606/33

OTHER PUBLICATIONS

T. Kulej, 'Regulated Capacitance Multiplier in CMOS Technology', 16th International Conference "Mixed Design of Integrated Circuit and Systems", Jun. 25-27, 2009, Poland.

* cited by examiner

*Primary Examiner* — Lincoln Donovan
*Assistant Examiner* — Diana J Cheng

(57) ABSTRACT

Capacitance multiplier circuitry provides an increased equivalent capacitance, and may be implemented using a desirably small footprint. As may be implemented in accordance with one or more embodiments, a capacitor provides a first capacitance across first and second plates, and capacitance multiplier circuitry operates with the capacitor to provide a second equivalent capacitance that is a multiple of the first capacitance. The capacitance multiplier circuitry includes a first circuit path having a first resistor between the first plate and a common terminal, and a second circuit path having a switch and a second resistor between the second plate and the common terminal. An amplifier has differential inputs respectively corresponding to the first and second circuit paths and provides the second equivalent capacitance by controlling operation of the switch based upon the differential inputs and the respective resistances provided by the resistors in the first and second circuit paths.

20 Claims, 3 Drawing Sheets

CAPACITANCE MULTIPLIER AND METHOD

Aspects of various embodiments are directed to providing capacitance multiplication.

Many circuit applications benefit from or require the use of capacitors to ensure proper operation. For example, narrow bandwidth loop compensation circuits, boost regulators, integrated pulse-width modulator (PWM) boost converters, LED drivers and low frequency phase-locked loops (PLLs) may benefit from the use of a capacitor and related circuitry.

In circuit applications such as those involving closed loop control of integrated circuit systems, a dominant pole is commonly generated for stability purposes. Such an approach can be implemented on the basis of control theory in the frequency domain. The dominant pole may be created by an on-chip capacitor with an amplifier such as a transconductance amplifier. A left hand plane (LHP) zero is often also generated to compensate for a phase shift caused by an existing pole in the loop. However, for circuits such as a PWM boost regulator (or converter), the control loop bandwidth is desirably limited due to the presence of a right hand plane (RHP) zero.

While many approaches involve providing a large-value compensation capacitor (e.g., 300 pF), such a capacitor can occupy a large die area. In many implementations, such a large area is impractical or not tolerable. These and other matters have presented challenges to the implementation of capacitors, for a variety of applications.

Various example embodiments are directed to capacitance multiplier circuits, their implementation and related methods. Many such embodiments are directed to addressing challenges, including those discussed above.

According to an example embodiment, an apparatus includes a capacitor circuit that provides a first capacitance across first and second capacitor plates, and capacitance multiplier circuitry that operates with the capacitor circuit to provide an equivalent capacitance that is a multiple of the first capacitance. The capacitance multiplier circuitry includes a first circuit path having a first resistor circuit between the first capacitor plate and a common terminal, as well as a second circuit path having a switch and a second resistor circuit coupled between the second capacitor plate and the common terminal. The apparatus also includes an amplifier circuit having differential inputs respectively corresponding to the first and second circuit paths, and which provide the second equivalent capacitance by controlling operation of the switch via an output thereof, the output being based upon the differential inputs and the respective resistances provided by the resistor circuits in the first and second circuit paths.

Another embodiment is directed to a method as follows. A first capacitance is provided across first and second capacitor plates, and an equivalent capacitance is generated at a multiple of the first capacitance. Specifically, an amplifier having differential inputs is used to control operation of a switch based upon first and second circuit paths, in which the first circuit path is connected to one of the differential inputs, and in which the second circuit path is connected to another one of the differential inputs. The first circuit path has a first resistor between the first capacitor plate and a common terminal, and the second circuit path has the switch and a second resistor coupled between the second capacitor plate and the common terminal. The equivalent capacitance is thus generated via control of the switch, using the respective resistances provided by the resistors in the first and second circuit paths.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
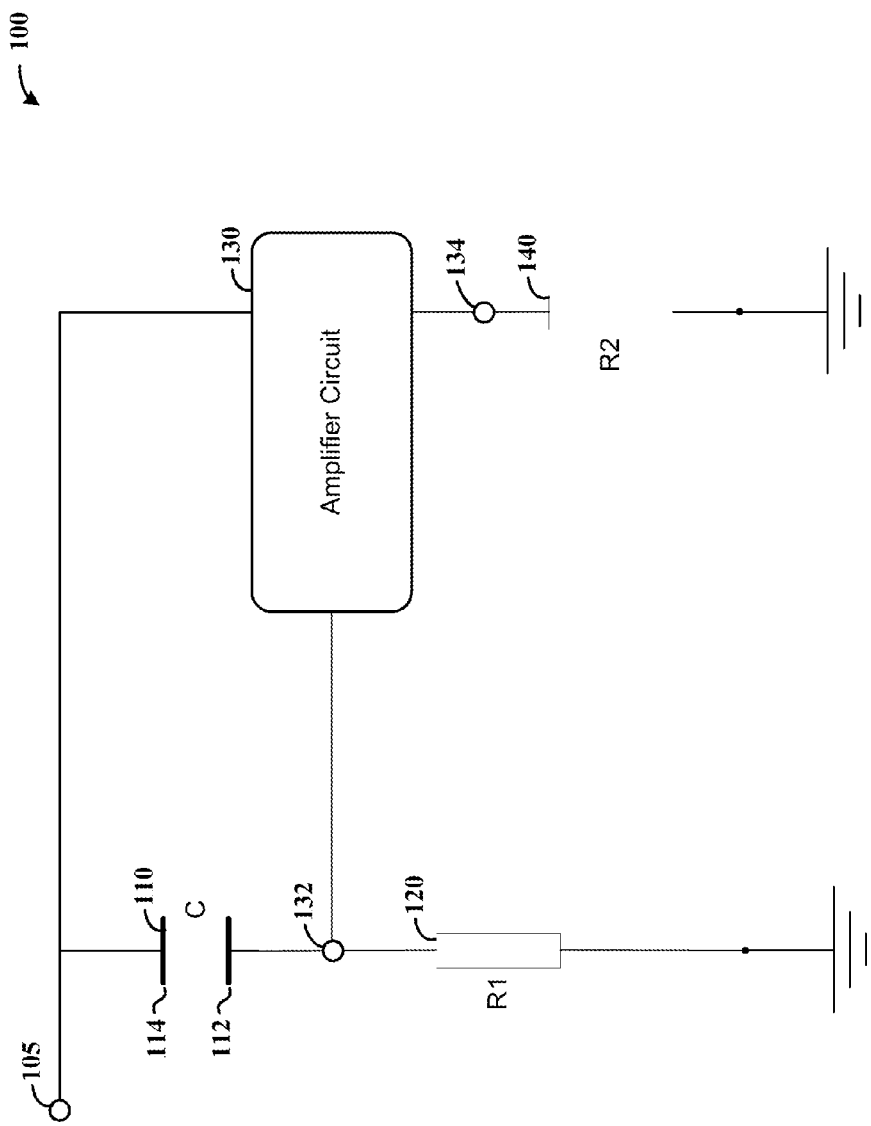
FIG. 1 shows a capacitance multiplier circuit, in accordance with an example embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods that provide a multiplied capacitance, as may be implemented in a multitude of disparate circuits. While not necessarily so limited, various aspects may be appreciated through a discussion of examples using this context.

Various example embodiments are directed to a capacitance multiplier, and to such a multiplier with an adjustable equivalent series resistance (ESR). In some implementations, the capacitance-multiplier circuit includes an active circuit with a capacitor, in which a total equivalent small-signal capacitance is a multiple (e.g., two or more) of an internal physical capacitor value. The active circuit effects the capacitance multiplication, without necessarily requiring a large die area as may be otherwise required for achieving the equivalent capacitance value (e.g., with capacitor plates covering a large area).

According to another example embodiment, a capacitance multiplier circuit includes a capacitor and an active circuit that enhances (multiplies) the capacitor to provide an equivalent capacitance that is a multiple (e.g., a few or many times) of the capacitance provided by the capacitor. One of the capacitor plates is connected, in a first circuit path, to a resistor that is connected between the capacitor plate and a common terminal. The other capacitor plate is connected in a second circuit path, to a switch and a second resistor that is connected between the other capacitor plate and the common terminal. An amplifier has differential inputs corresponding to (e.g., coupled to) the first and second circuit paths, and generates the equivalent capacitance by controlling operation of the switch based on the values provided at the differential inputs, and related to the respective resistances provided by the resistors.

In some embodiments, one or more resistors in the capacitance multiplier is dynamically adjustable. For instance, the resistor in the first path discussed above can be adjusted to set a multiplier of the capacitor. In some implementations, the resistor in the second circuit path is adjustable, and can be adjusted based upon any adjustment made to the other resistor to maintain a ratio/fixed fraction of the first resistor.

In certain embodiments, the capacitance multiplier is used to compensate for a phase shift. In one such embodiment, a pole generator and another amplifier are connected in a closed loop, and the capacitance multiplier provides the equivalent capacitance in connection with a left-hand plane zero to compensate for the phase shift. For instance, where the pole generator has a left-hand plane pole that causes a phase-shift of signals passed in the loop and dependent upon the pole, such a phase shift can be compensated by providing the left-hand plane zero with the capacitance multiplier. In certain implementations, the left-hand plane zero is provided at a derivative of the product of the capacitance and resistance respectively provided by the capacitor and the first resistor. In some embodiments, phase shift compensation is carried out by monitoring a node at which the equivalent capacitance is provided, detecting any such phase shift and compensating for it by dynamically modifying one or both resistors to tune the equivalent capacitance.

In further embodiments, a bias current is used to enhance or otherwise implement the equivalent capacitance. In one such embodiment, a bias current source is used to provide a bias current to a node between the capacitor and the resistor in the first current path. Another bias current source provides a bias current to a node between the capacitor and the switch. These bias current circuits operate with the amplifier, resistors and switch to provide the equivalent capacitance.

In another embodiment involving the bias current sources, an additional resistor is used to enhance the capacitance. In one implementation, the additional resistor is coupled to a node between the capacitor and a circuit port at which the equivalent capacitance is provided. In another implementation the additional resistor is coupled to a node between the capacitor and a node between the capacitor and the resistor at which the one of the bias circuits provides a bias current. In each implementation, the additional resistor operates with the bias current, other resistors and the amplifier to provide the equivalent capacitance.

In a further embodiment, an amplifier and a pole generator are connected in a closed loop with the capacitance multiplier. The pole generator provides a pole and a phase-shift of signals passed in the loop, which is compensated for stability. The amplifiers, resistors, switch and capacitor compensate for the phase shift. For instance, the compensation can be carried out by generating a left-hand plane zero at a derivative of the product of the capacitance and resistance provided by the capacitor and resistor in the first circuit path.

Another embodiment is directed to an apparatus including a capacitor, first and second resistors coupled to common terminal(s), a transistor, and an amplifier, all of which operate to provide an equivalent capacitance. The capacitor has respective plates, one of which is coupled to an input port and the other of which is coupled to the first resistor. The second resistor has a resistance that is less than that of the first resistor circuit. The transistor's source and drain are coupled between the input port and the second resistor. The amplifier has differential inputs, the first of which is connected to a circuit node between the capacitor and the first resistor, and the second of which is connected to a circuit node between the transistor and the second resistor. The output of the amplifier drives the gate of the transistor, for switching the transistor between on and off states in which the amplifier circuit, resistor circuits and transistors provide an equivalent capacitance at the input port as a multiple of the capacitor's capacitance. The equivalent capacitance may, for example, be generated to compensate for a phase shift at the input port, by providing a left-hand plane zero at a derivative of the product of the capacitance and resistance of the capacitor and first resistor. In some implementations, one or both of the resistors are dynamically adjustable (e.g., with a fixed or variable ratio between the resistors) and operate to tune the equivalent capacitance via such adjustment.

Another embodiment is directed to a method in which an equivalent capacitance is generated using a capacitor and an active circuit that operate to provide the equivalent capacitance as a multiple of the capacitance provided by the capacitor. Specifically, an amplifier having differential inputs is used to control operation of a switch based on values provided to the inputs. One input is connected to a circuit path having a resistor between the capacitor and a common terminal, and the other input is connected to a circuit path having the switch and a second resistor that are coupled between the capacitor and the common terminal (or another coupled common terminal). Such an approach can be implemented to compensate for phase shift as described above, generated by a pole generator having a left-hand plane pole, by providing a left-hand plane zero (e.g., providing a derivative of the product of the first capacitance and a resistance provided by the first resistor circuit). Further, as discussed above, one or more resistor values can be dynamically adjusted to tune the equivalent capacitance.

The capacitance multiplier circuits and related methods as described herein are used in a variety of applications, to suit many uses. In some embodiments, a capacitance multiplier is used in low bandwidth applications, such as those involving a low-frequency PLL, a boost regulator, or a low bandwidth filter, in which a high-value on-chip capacitor is useful. In a particular embodiment involving a flash LED boost regulator, a capacitance multiplier as discussed herein is used to provide an equivalent 200-300 pF on-chip capacitance, without necessarily occupying a large die area. For instance, such a capacitance multiplier can be implemented to provide an equivalent capacitance of a large capacitor at about $1/10^{th}$ the area of such a large capacitor.

Turning now to the figures, FIG. 1 shows a capacitance multiplier circuit 100 that provides an equivalent capacitance as seen on an input or loop node 105, in accordance with another example embodiment. The multiplier circuit 100 includes a capacitor 110 having a first plate 112 connected to a resistor 120 and amplifier circuit 130, and a second plate 114 connected through the amplifier circuit 130 and a resistor 140. The amplifier circuit 130 selectively couples the second plate 114 to the resistor 140, which operates to apply the respective resistances across the capacitor 110, and therein generate an equivalent capacitance on the input or loop node 105. In some implementations, the amplifier circuit selectively couples the second plate 114 based on a differential input corresponding to respective values presented at nodes 132 and 134. As such, an (active) amplifier circuit can be used to generate an effective capacitance that is many times greater than the capacitance provided by capacitor 110 alone, and can do so with a relatively low footprint within an integrated circuit.

Referring again to FIG. 1, the described embodiments and both the ensuing figures and claims, one or more aspects of various embodiments may be combined, and various aspects of individual embodiments may be implemented separately. For instance, aspects of FIG. 1 such as those pertaining to the block representing amplifier circuit 130 may be implemented using various different circuits, including one or more switches and amplifiers, as described and/or shown in the remaining figures. Further, some embodiments are directed to active capacitance-matching components, which may be implemented separately from the capacitor that provides the base capacitance to be multiplied (e.g., capacitor 110), and to control circuitry that effects the operation of such an active circuit.

Figure 2:
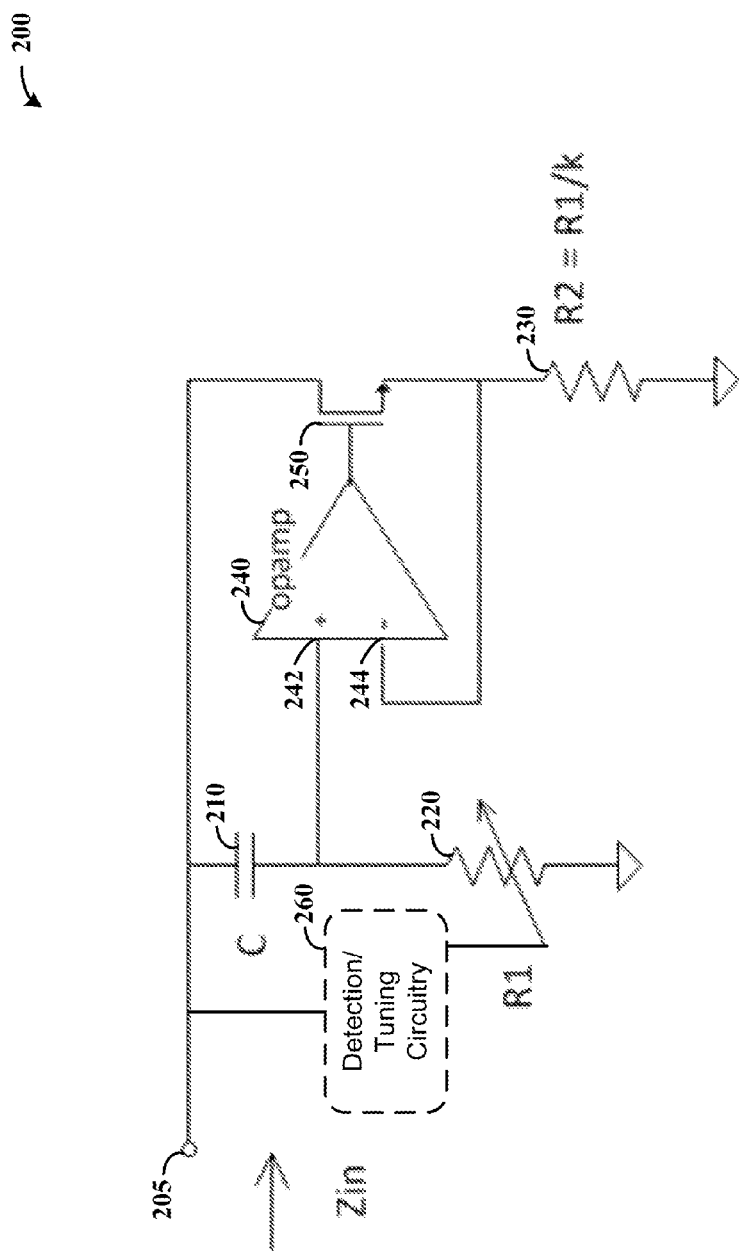
FIG. 2 shows another capacitance multiplier circuit, in accordance with another example embodiment.

FIG. 2 shows another capacitance multiplier circuit 200, in accordance with another example embodiment. The capacitance multiplier circuit 200 includes a capacitor 210 connected to a ground or reference node via resistor 220, having a value "R1" that may, in some embodiments, be variable. The resistor 220 is complemented by resistor 230, which is connected at the control of op-amp 240 and transistor (switch) 250. Specifically, the op-amp 240 has differential inputs 242 and 244, with the differential input 242 connected between the capacitor 210 and the resistor 220, and with differential input 244 connected between the transistor (switch) 250 and the resistor 230. In some instances, the resistor 230 has a value that is fixed relative to resistor 220, here shown as a value "R2" that is fixed relative to a value "R1" (of resistor 220) and a constant "k." In various embodiments, the equivalent capacitance ($C_{eq}$) and equivalent resistance ($R_{eq}$) of the capacitance multiplier circuit 200 is represented as:

$$C_{eq} := C \cdot \frac{R1}{R2}$$

$$R_{eq} := R2$$

The capacitance multiplier accordingly exhibits impedance in accordance with the following equation (in Laplace transform format):

$$Z_{in}(s) := \frac{(1 + s \cdot R1 \cdot C)}{s \cdot C \cdot \left(1 + \frac{R1}{R2}\right)}$$

As such, the effective (total) capacitance at node 205 is amplified by R1/R2 in the above equation. The capacitance multiplier circuit 200 thus generates a LHP zero at R1*C.

In some implementations in which the resistor 220 is variable, R1 can be adjusted to set the LHP zero, such as to compensate for phase shift in a loop or other circuit coupled to node 205. For example, by detecting phase shift and/or other indications thereof, the resistor 220 can be tuned to set the resulting LHP zero. Detection/tuning circuitry 260 is optionally implemented in this regard, for dynamically tuning the resistance R1 provided by the resistor 220. In some implementations, the detection/tuning circuitry 260 may also be implemented to dynamically modify the resistance R2 provided by resistor 230. Using such approaches, a wide input voltage range can be accommodated with an accurately adjustable ESR as relates to a LHP zero, and low quiescent current.

Figure 3:
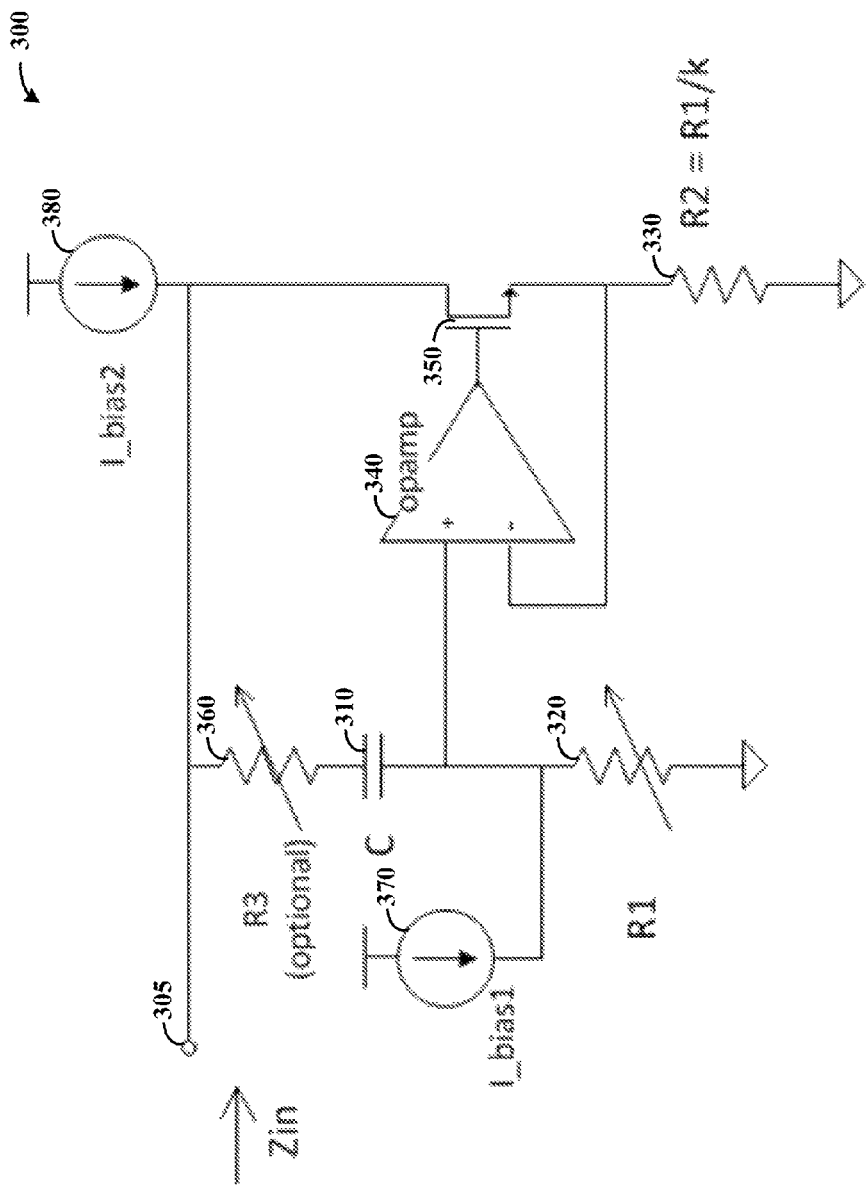
FIG. 3 shows another capacitance multiplier circuit with bias current, in accordance with another example embodiment.

FIG. 3 shows another capacitance multiplier circuit 300 with bias current, in accordance with another example embodiment. The circuit 300 is similar to the multiplier circuit 200 in FIG. 2, and may be implemented similarly. For instance, a capacitor 310 is coupled to a ground node via resistor 320, which together with resistor 330 sets a multiplier for an equivalent generated capacitance at node 305. Each of resistors 320 and 330 may be implemented as variable resistors, using an approach such as that described with FIG. 2.

An op-amp 340 operates a transistor 350 for coupling the respective resistors 320 and 330 across the capacitor 310. A third resistor 360 is optionally included, and may be variable as well. Bias current source 370 provides a bias current at a node between the capacitor 310 and resistor 320, and bias current source 380 provides another bias current at a node between the capacitor 310 and the transistor 350 (and resistor 330, when the transistor is closed). The third resistor 360 may, for example, be implemented for further fine-tuning a LHP zero location. Further, in some embodiments, the resistor 360 and capacitor 310 are swapped in position.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., multiplying circuitry, or tuning/phase detection circuitry). For example, in certain of the above-discussed embodiments, one or more modules are discrete logic circuits or programmable logic circuits configured and arranged for implementing these operations/activities, as in the circuit modules shown in FIG. 1. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, additional resistors may be implemented as shown, to fine tune LHP zeros. Such modifications do not depart from the true spirit and scope of various aspects of the invention, including aspects set forth in the claims.

What is claimed is:

1. An apparatus comprising:
a capacitor circuit configured and arranged to provide a first capacitance across first and second capacitor plates; and
capacitance multiplier circuitry configured and arranged with the capacitor circuit to provide a second equivalent capacitance that is a multiple of the first capacitance, the capacitance multiplier circuitry including:
a first circuit path having a first resistor circuit between the first capacitor plate and a common terminal;
a second circuit path having a switch and a second resistor circuit coupled between the second capacitor plate and the common terminal; and
an amplifier circuit having differential inputs respectively corresponding to the first and second circuit paths and being configured and arranged to provide the second equivalent capacitance by controlling operation of the switch via an output of the amplifier circuit, based upon the differential inputs and the respective resistances provided by the resistor circuits in the first and second circuit paths.

2. The apparatus of claim 1, further including a second amplifier and a pole generator circuit connected in a closed loop with a loop node at which the second equivalent capacitance is provided, the pole generator having a left-hand plane pole that causes a phase-shift of signals passed in the loop that is dependent upon the pole, wherein the amplifier circuit, resistor circuits, transistor and capacitor are configured and arranged to compensate for the phase shift by providing a left-hand plane zero.

3. The apparatus of claim 1, wherein
the first resistor circuit is dynamically adjustable, wherein the amplifier circuit, resistor circuits and transistor are configured and arranged to provide the second equivalent capacitance by adjusting the resistance of the first resistor circuit; and
the second equivalent capacitance is equal to a product of the first capacitance and a resistance of the first resistor circuit divided by a resistance of the second resistor circuit.

4. The apparatus of claim 3, wherein the second resistor circuit is tunable and configured and arranged to dynamically adjust the second resistance by maintaining the second resistance at a fixed fraction of the first resistance.

5. The apparatus of claim 1, wherein the amplifier circuit, resistor circuits and switch are configured and arranged to provide the second equivalent capacitance at an input port circuit connected to the first and second circuit paths, as an equivalent capacitance that is a multiple of the first capacitance.

6. The apparatus of claim 1, wherein the amplifier circuit, resistor circuits, transistor and capacitor are configured and arranged to compensate for a phase shift by providing a left-hand plane zero at a derivative of a product of the first capacitance and a resistance provided by the first resistor circuit.

7. The apparatus of claim 1, further including a first bias current circuit configured and arranged to provide a first bias current to a first node between the capacitor circuit and the first resistor circuit, and a second bias current circuit configured and arranged to provide a second bias current to a second node between the capacitor circuit and the switch, the first and second bias current circuits being configured and arranged with the amplifier circuit, resistor circuits and switch to provide the second equivalent capacitance.

8. The apparatus of claim 7, further including a third resistor circuit coupled to a node between the capacitor circuit and an input port circuit at which the second equivalent capacitance is provided, the third resistor circuit being configured and arranged with the bias current circuits, the first and second resistor circuits and the amplifier circuit to provide the second equivalent capacitance.

9. The apparatus of claim 7, further including a third resistor circuit coupled to a node between the capacitor circuit and the node at which the first bias circuit is configured and arranged to provide the first bias current, the third resistor circuit being configured and arranged with the bias current circuits, the first and second resistor circuits and the amplifier circuit to provide the second equivalent capacitance.

10. The apparatus of claim 7, further including a second amplifier and a pole generator circuit connected in a closed loop with the second node, the pole generator circuit being operable to provide a pole and a phase-shift of signals passed in the loop that is dependent upon the pole, wherein the amplifier circuit, resistor circuits, switch and capacitor of the capacitance multiplier circuitry are configured and arranged to compensate for the phase shift.

11. The apparatus of claim 10, wherein the amplifier circuit, resistor circuits, switch and capacitor of the capacitance multiplier circuitry are configured and arranged to compensate for the phase shift by generating a left-hand plane zero at a derivative of a product of the first capacitance and the first resistance.

12. An apparatus comprising:
a capacitor circuit having a first plate coupled to an input port circuit and a second plate and configured and arranged to provide a first capacitance across the first and second plates;
a first resistor circuit coupled to the second plate of the capacitor and having a first resistance;
a second resistor circuit having a second resistance that is less than a resistance of the first resistor circuit and coupled to a common terminal;
a transistor having a source and drain coupled between the input port circuit and the second resistor circuit; and
an amplifier circuit having
a first input connected to a circuit node between the capacitor and the first resistor circuit,
a second input connected to a circuit node between the transistor and the second resistor circuit, and
an output connected to a gate of the transistor and configured and arranged to switch the transistor between on and off states in which the amplifier circuit, resistor circuits and transistors are configured and arranged to provide a second capacitance via the input port circuit, the second capacitance being an equivalent capacitance that is a multiple of the first capacitance.

13. The apparatus of claim 12, wherein the first resistor circuit is dynamically adjustable, wherein the amplifier circuit, resistor circuits and transistor are configured and arranged to provide the second capacitance by adjusting the resistance of the first resistor circuit to tune the second capacitance to a multiple of the first capacitance.

14. The apparatus of claim 13, wherein the second resistor circuit is tunable and configured and arranged to dynamically adjust the second resistance by maintaining the second resistance at a fixed fraction of the first resistance.

15. The apparatus of claim 12, wherein the amplifier circuit, resistor circuits, transistor and capacitor are configured and arranged to compensate for a phase shift at the input port circuit by providing a left-hand plane zero at a derivative of a product of the first capacitance and the first resistance.

16. A method comprising
providing a first capacitance across first and second capacitor plates;
providing a second equivalent capacitance that is a multiple of the first capacitance by, using an amplifier circuit having differential inputs, controlling operation of a switch based upon:
a first circuit path connected to one of the differential inputs and having a first resistor circuit between the first capacitor plate and a common terminal, and
a second circuit path connected to another one of the differential inputs and having the switch and a second resistor circuit coupled between the second capacitor plate and the common terminal, using the respective resistances provided by the resistor circuits in the first and second circuit paths.

17. The method of claim 16, further including using the amplifier circuit, resistor circuits, transistor and capacitor to compensate for phase shift generated by a pole generator having a left-hand plane pole, by providing a left-hand plane zero.

18. The method of claim 17, wherein providing the left-hand plane zero includes providing the left-hand plane zero at a derivative of a product of the first capacitance and a resistance provided by the first resistor circuit.

19. The method of claim 16, wherein providing the second equivalent capacitance, using the respective resistances, includes dynamically adjusting the first resistor circuit to tune the second equivalent capacitance to a multiple of the first capacitance.

20. The method of claim 19, further including maintaining the second resistance at a fixed fraction of the first resistance by dynamically adjusting the second resistor circuit, based upon the adjusting of the first resistor circuit.

* * * * *